United States Patent
Post et al.

(10) Patent No.: US 8,503,257 B2
(45) Date of Patent: Aug. 6, 2013

(54) READ DISTURB SCORECARD

(75) Inventors: Daniel J. Post, Campbell, CA (US); Hsiao Thio, San Jose, CA (US)

(73) Assignee: Apple Inc., Cupertino, CA (US)

( * ) Notice: Subject to any disclaimer, the term of this patent is extended or adjusted under 35 U.S.C. 154(b) by 346 days.

(21) Appl. No.: 12/847,769

(22) Filed: Jul. 30, 2010

(65) Prior Publication Data

US 2012/0030506 A1    Feb. 2, 2012

(51) Int. Cl.
 *G11C 7/00*    (2006.01)

(52) U.S. Cl.
 USPC .. 365/200; 365/185.09; 365/201; 365/185.12

(58) Field of Classification Search
 USPC ........... 365/200, 185.09, 201, 185.12, 203.05
 See application file for complete search history.

(56) References Cited

U.S. PATENT DOCUMENTS

| | | |
|---|---|---|
| 6,009,537 A | 12/1999 | Tanimoto et al. |
| 7,114,024 B2 | 9/2006 | Herbst |
| 2007/0140003 A1* | 6/2007 | Ido .............................. 365/185.2 |
| 2008/0082736 A1 | 4/2008 | Chow et al. |
| 2009/0193174 A1* | 7/2009 | Reid .............................. 711/100 |
| 2009/0282300 A1 | 11/2009 | Heyrman et al. |
| 2009/0323412 A1 | 12/2009 | Mokhlesi et al. |
| 2011/0040932 A1* | 2/2011 | Frost et al. ..................... 711/103 |

* cited by examiner

*Primary Examiner* — Vu Le
*Assistant Examiner* — Han Yang
(74) *Attorney, Agent, or Firm* — Van Court & Aldridge LLP (57) ABSTRACT

Systems and methods are disclosed for handling read disturbs based on one or more characteristics of read operations performed on a non-volatile memory ("NVM"). In some embodiments, a control circuitry of a system can generate a variable damage value determined based on one or more characteristics of a read operation. Using the damage value, the control circuitry can update a score associated with the block. If the control circuitry determines that the score exceeds a pre-determined threshold, at least a portion of the block can be relocated to a different memory location in the NVM. In some embodiments, portions of the block may be relocated over a period of time.

27 Claims, 5 Drawing Sheets

READ DISTURB SCORECARD

FIELD OF THE INVENTION

This can relate to systems and methods for handling read disturbs based on one or more characteristics of read operations performed on a non-volatile memory.

BACKGROUND OF THE DISCLOSURE

NAND flash memory, as well as other types of non-volatile memories ("NVMs"), are commonly used for mass storage. For example, consumer electronics such as portable media players often include flash memory to store music, videos, and other media.

Non-volatile memories, however, may develop defective memory cells through everyday use. For example, operational memory cells may suffer from read disturbs due to repeated read operations of neighboring cells. When a memory location, such as a page, of a NVM contains too many defective cells, the information contained within that memory location may be lost.

Conventionally, in order to prevent information loss due to read disturbs, a block of the NVM can be relocated after a fixed number of read operations have been performed on the block. During the relocation process, data contained in the block can be copied to another block of the NVM. Unfortunately, unnecessary relocations increase the number of writes that must be performed on the NVM and can consequently shorten the lifespan of the NVM.

SUMMARY OF THE DISCLOSURE

Systems and methods are disclosed for handling read disturbs based on one or more characteristics of read operations performed on a non-volatile memory ("NVM"). A system can assume that read operations performed on a block of the NVM may cause variable amounts of read disturb damage. By calculating the destructive probabilities of read operations and adjusting a threshold for relocating portions of a block, the system can reduce the likelihood of unnecessary relocations. At the same time, the system can reduce the number of write operations that must be performed on the NVM and increase the lifespan of the NVM.

In some embodiments, a control circuitry of the system can determine that a read operation is being performed on a memory location of a block. The control circuitry can then update a score associated with the block based on one or more characteristics of the read operation. For example, the control circuitry can assign a damage value to the read operation based on the one or more characteristics. The control circuitry can then update the score by incrementing it by the assigned damage value. The one or more characteristics may include, for example, a physical position of the memory location (e.g., a beginning, middle, or end of the block and/or an upper page or lower page of the block), a word line associated with the memory location, an amount of time associated with the read operation, and/or a susceptibility to error of the memory location (e.g., obtained based on one or more tests performed on the block).

After updating the score, the control circuitry can determine if the score exceeds a pre-determined threshold. The value of the pre-determined threshold can be adjusted based on one or more factors. For example, the value of the pre-determined threshold can be adjusted based on a quality of the block (e.g., as determined based on one or more tests performed on the block). As another example, the value of the pre-determined threshold can be adjusted based on one or more tolerance thresholds. For instance, the tolerance thresholds can indicate when read operations performed on a block will likely cause read disturb damage (e.g., a tolerance threshold of the amount of time for read operations or a tolerance threshold of a number of read operations).

If the score exceeds the pre-determined threshold, the control circuitry can direct a bus controller to relocate at least a portion of the block to a different memory location in the NVM. In some embodiments, the entire block may be relocated to another block of the NVM. In other embodiments, portions of the block may be relocated over a period of time. The order in which the portions are relocated may be determined based on any suitable factor(s) such as, for example, the susceptibility to error of portions of the block (e.g., determined based on one or more tests performed on the block), a total number of read operations that has been performed on each word line of the block over a period of time, any combination thereof, and/or any other suitable factor(s).

In some embodiments, pages or word lines of the block can be ranked based on one or more of these factors (e.g., based on decreasing susceptibility to error and/or the total number of read operations performed on each word line), and the pages or the word lines can be relocated in an order corresponding to the rankings.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION OF THE DISCLOSURE

Figure 1:
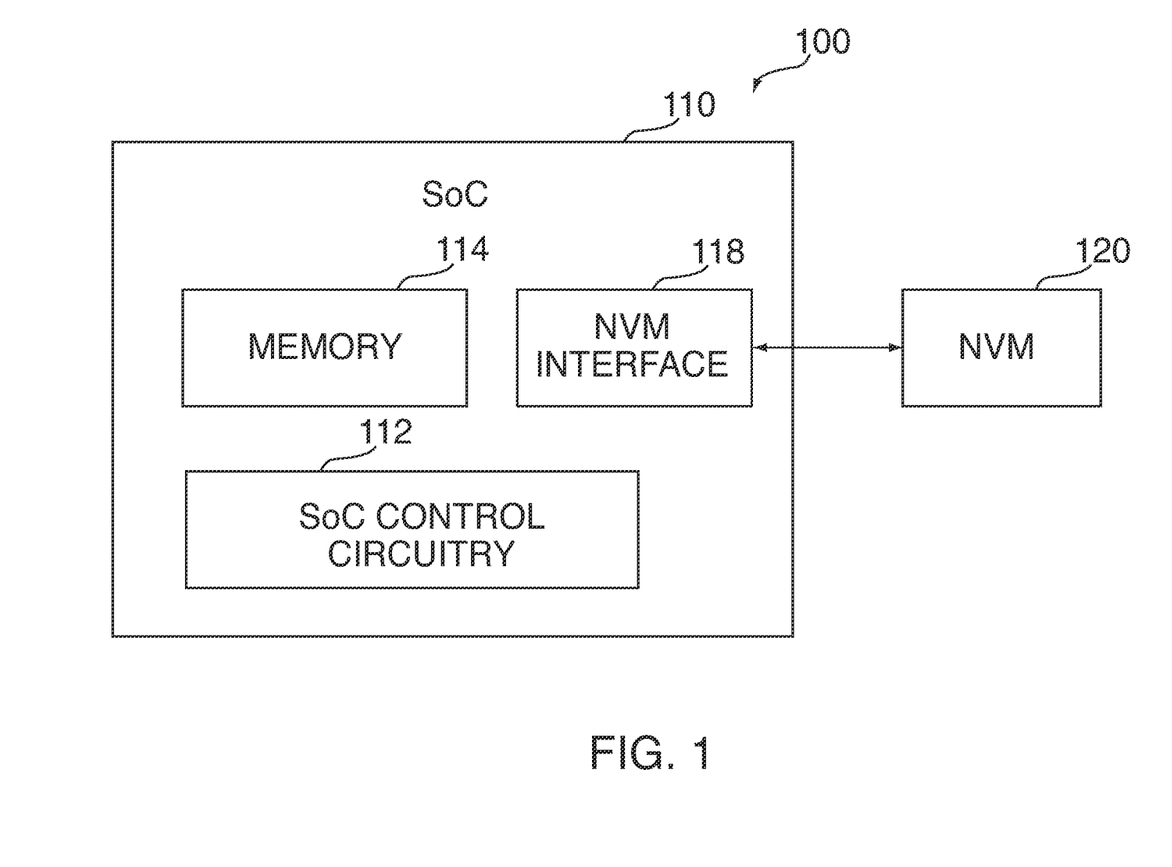
FIGS. 1 and 2 are schematic views of electronic devices configured in accordance with various embodiments of the invention.

FIG. 1 is a schematic view of electronic device 100. In some embodiments, electronic device 100 can be or can include a portable media player (e.g., an iPod™ made available by Apple Inc. of Cupertino, Calif.), a cellular telephone (e.g., an iPhone™ made available by Apple Inc.), a pocket-sized personal computer, a personal digital assistance ("PDA"), a desktop computer, a laptop computer, and any other suitable type of electronic device.

Electronic device 100 can include system-on-a-chip ("SoC") 110 and non-volatile memory ("NVM") 120. Non-volatile memory 120 can include a NAND flash memory based on floating gate or charge trapping technology, NOR flash memory, erasable programmable read only memory ("EPROM"), electrically erasable programmable read only memory ("EEPROM"), Ferroelectric RAM ("FRAM"), magnetoresistive RAM ("MRAM"), any other known or future types of non-volatile memory technology, or any combination thereof.

NVM 120 can be organized into "blocks", which is the smallest erasable unit, and further organized into "pages", which can be the smallest unit that can be programmed or read. In some embodiments, NVM 120 can include multiple integrated circuits, where each integrated circuit may have multiple blocks. The blocks from corresponding integrated circuits (e.g., blocks having the same position or block number) may form "super blocks." Each memory location (e.g., page or block) of NVM 120 can be addressed using a physical address (e.g., a physical page address or physical block address).

Physically, a block in NVM 120 can include an array of memory cells aligned in rows corresponding to "word lines". The memory cells of a block may be configured as single-level cells ("SLC") or multi-level cells ("MLC"), and each word line in the block may be configured for use in storing one page (in a SLC case) or multiple pages (in a MLC case). Thus, the number of pages in a given block may be based on the number of bits stored per memory cell. Due to the increased density of storage, a block being used as a 2-bit MLC block may include twice the number of pages as when the same block is being used as an SLC block. In some embodiments, for a block composed of 64 word lines, the block may include 64 pages when used as a SLC block, 128 pages when used as a 2-bit MLC block, 192 pages when used as a 3-bit MLC block, and so on. These numbers, however, are merely illustrative and a block of NVM 120 may include any other suitable number of pages.

FIG. 1, as well as later figures and various disclosed embodiments, may sometimes be described in terms of using flash technology. However, this is not intended to be limiting, and any other type of non-volatile memory can be implemented instead. Electronic device 100 can include other components, such as a power supply or any user input or output components, which are not depicted in FIG. 1 to prevent overcomplicating the figure.

System-on-a-chip 110 can include SoC control circuitry 112, memory 114, and NVM interface 118. SoC control circuitry 112 can control the general operations and functions of SoC 110 and the other components of SoC 110 or device 100. For example, responsive to user inputs and/or the instructions of an application or operating system, SoC control circuitry 112 can issue read or write commands to NVM interface 118 to obtain data from or store data in NVM 120. For clarity, data that SoC control circuitry 112 may request for storage or retrieval may be referred to as "user data," even though the data may not be directly associated with a user or user application. Rather, the user data can be any suitable sequence of digital information generated or obtained by SoC control circuitry 112 (e.g., via an application or operating system).

SoC control circuitry 112 can include any combination of hardware, software, and firmware, and any components, circuitry, or logic operative to drive the functionality of electronic device 100. For example, SoC control circuitry 112 can include one or more processors that operate under the control of software/firmware stored in NVM 120 or memory 114.

Memory 114 can include any suitable type of volatile or non-volatile memory, such as dynamic random access memory ("DRAM"), synchronous dynamic random access memory ("SDRAM"), double-data-rate ("DDR") RAM, cache memory, read-only memory ("ROM"), or any combination thereof. Memory 114 can include a data source that can temporarily store user data for programming into or reading from non-volatile memory 120. In some embodiments, memory 114 may act as the main memory for any processors implemented as part of SoC control circuitry 112.

NVM interface 118 may include any suitable combination of hardware, software, and/or firmware configured to act as an interface or driver between SoC control circuitry 112 and NVM 120. For any software modules included in NVM interface 118, corresponding program code may be stored in NVM 120 or memory 114.

NVM interface 118 can perform a variety of functions that allow SoC control circuitry 112 to access NVM 120 and to manage the memory locations (e.g., pages, blocks, super blocks, integrated circuits) of NVM 120 and the data stored therein (e.g., user data). For example, NVM interface 118 can interpret the read or write commands from SoC control circuitry 112, perform wear leveling, and generate read and program instructions compatible with the bus protocol of NVM 120.

While NVM interface 118 and SoC control circuitry 112 are shown as separate modules, this is intended only to simplify the description of the embodiments of the invention. It should be understood that these modules may share hardware components, software components, or both. For example, a processor implemented as part of SoC control circuitry 112 may execute a software-based memory driver for NVM interface 118. Accordingly, portions of SoC control circuitry 112 and NVM interface 118 may sometimes be referred to collectively as "control circuitry."

FIG. 1 illustrates an electronic device where NVM 120 may not have its own controller. In other embodiments, electronic device 100 can include a target device, such as a flash or SD card, that includes NVM 120 and some or all portions of NVM interface 118 (e.g., a translation layer, discussed below). In these embodiments, SoC 110 or SoC control circuitry 112 may act as the host controller for the target device. For example, as the host controller, SoC 110 can issue read and write requests to the target device.

Figure 2:
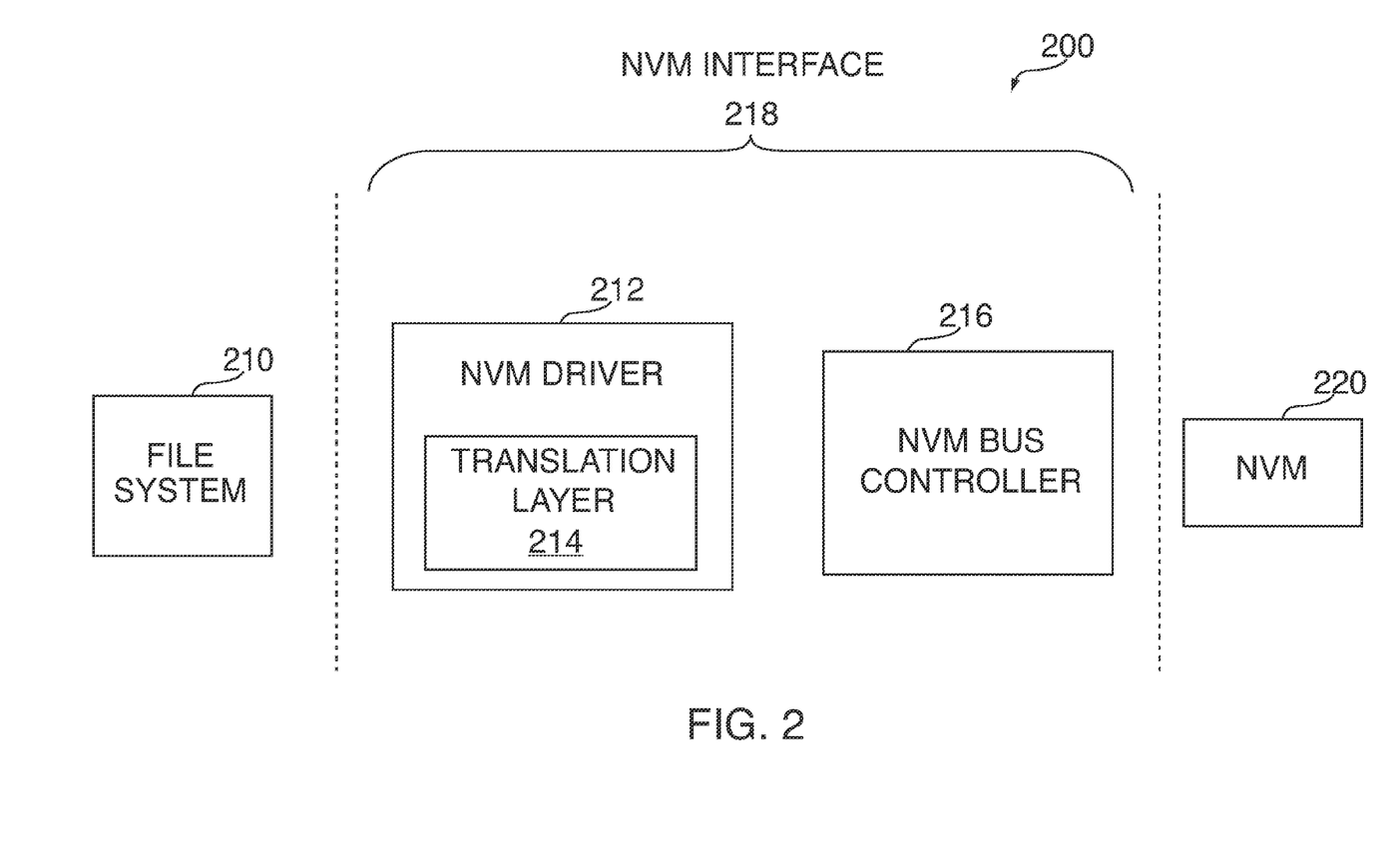

FIG. 2 is a schematic view of electronic device 200, which may illustrate in greater detail some of the firmware, software and/or hardware components of electronic device 100 (FIG. 1) in accordance with various embodiments. Electronic device 200 may have any of the features and functionalities described above in connection with FIG. 1, and vice versa. Electronic device 200 can include file system 210, NVM driver 212, NVM bus controller 216, and NVM 220. In some embodiments, file system 210 and NVM driver 212 may be software or firmware modules, and NVM bus controller 216 and NVM 220 may be hardware modules. Accordingly, in these embodiments, NVM driver 212 may represent the software or firmware aspect of NVM interface 218, and NVM bus controller 216 may represent the hardware aspect of NVM interface 218.

File system 210 can include any suitable type of file system and may be part of the operating system of electronic device 200 (e.g., part of SoC control circuitry 112 of FIG. 1). In some embodiments, file system 210 may include a flash file system, which provides a logical to physical mapping of pages. File system 210 may perform some or all of the functionalities of NVM driver 212 discussed below, and therefore file system 210 and NVM driver 212 may or may not be separate modules.

File system 210 may manage file and folder structures for the application and operating system. File system 210 may operate under the control of an application or operating system running on electronic device 200, and may provide write and read commands to NVM driver 212 when the application or operating system requests that information be read from or stored in NVM 220. Along with each read or write command, file system 210 can provide a logical address to indicate where the user data should be read from or written to, such as a logical page address or a logical block address with a page offset.

File system 210 may provide read and write requests to NVM driver 212 that are not directly compatible with NVM 220. For example, the logical addresses may use conventions or protocols typical of hard-drive-based systems. A hard-drive-based system, unlike flash memory, can overwrite a memory location without first performing a block erase. Moreover, hard drives may not need wear leveling to increase the lifespan of the device. Therefore, NVM interface 218 can perform any functions that are memory-specific, vendor-specific, or both to handle file system requests and perform other management functions in a manner suitable for NVM 220.

NVM driver 212 can include translation layer 214. In some embodiments, translation layer 214 may be or include a flash translation layer ("FTL"). On a write operation, translation layer 214 can map the provided logical address to a free, erased physical location on NVM 220. On a read operation, translation layer 214 can use the provided logical address to determine the physical address at which the requested data is stored. Because each NVM may have a different layout depending on the size or vendor of the NVM, this mapping operation may be memory and/or vendor-specific. Translation layer 214 can perform any other suitable functions in addition to logical-to-physical address mapping. For example, translation layer 214 can perform any of the other functions that may be typical of flash translation layers, such as garbage collection and wear leveling.

NVM driver 212 may interface with NVM bus controller 216 to complete NVM access requests (e.g., program, read, and erase requests). Bus controller 216 may act as the hardware interface to NVM 220, and can communicate with NVM 220 using the bus protocol, data rate, and other specifications of NVM 220.

NVM interface 218 may manage NVM 220 based on memory management data, sometimes referred to herein as "metadata". The metadata may be generated by NVM driver 212 or may be generated by a module operating under the control of NVM driver 212. For example, metadata can include any information used for managing the mapping between logical and physical addresses, bad block management, wear leveling, error correcting code ("ECC") data, or any combination thereof. The metadata may include data provided by file system 210 along with the user data, such as a logical address. Thus, in general, "metadata" may refer to any information about or relating to user data or used generally to manage the operation and memory locations of a non-volatile memory.

NVM interface 218 may be configured to store metadata in NVM 220. In some embodiments, NVM interface 218 may store metadata associated with user data at the same memory location (e.g., page) in which the user data is stored. For example, NVM interface 218 may store user data, the associated logical address, and ECC data for the user data at one or more memory locations of NVM 220. NVM interface 218 may also store other types of metadata about the user data in the same memory location. For example, the metadata may contain a flag that indicates whether the stored data is good data.

NVM interface 218 may store the logical address so that, on power-up of NVM 220 or during operation of NVM 220, electronic device 200 can determine what data resides at that location. In particular, because file system 210 may reference the user data according to its logical address and not its physical address, NVM interface 218 may store the user data and logical address together to maintain their association. For example, in embodiments where NVM interface 218 maps logical sectors directly to physical pages, NVM interface 218 may store logical-to-physical mappings in pages in the NVM.

Figure 3:
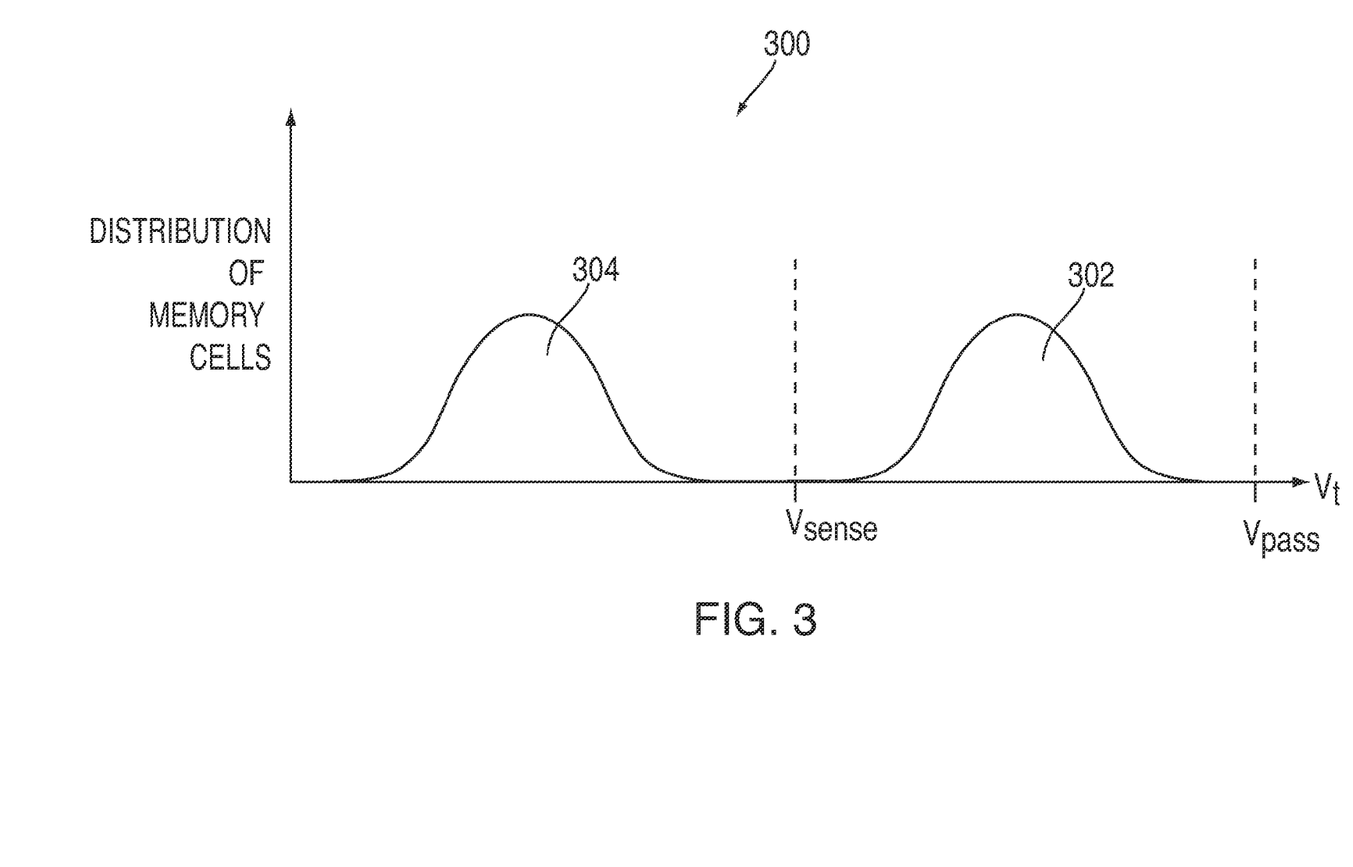
FIG. 3 is a graphical view of an illustrative graph of threshold voltages for a single-level cell ("SLC") block in accordance with various embodiments of the invention.

In some embodiments, a NVM (e.g., NVM 120 of FIG. 1 or NVM 220 of FIG. 2) may include a SLC block capable of storing one bit of data per memory cell. FIG. 3 is a graphical view of an illustrative graph 300 of threshold voltages of a SLC block in accordance with various embodiments of the invention.

As discussed previously, a block of a NVM can include arrays of memory cells composed of floating gate transistors. In order to store bits of data, charge may be stored or left off of a floating gate of each transistor. For example, the floating gate of a transistor may be charged to indicate a particular bit value (e.g., a bit value of '0'). Alternatively, the floating gate may be left uncharged to indicate a different bit value (e.g., a bit value of '1').

The charge or lack thereof on a transistor may affect a threshold voltage (e.g., $V_t$) of the transistor. For example, when a transistor is charged, the threshold voltage may be relatively high (e.g., higher than 0 V), and the memory cell can be considered to be in a "programmed" state. In contrast, when a transistor is uncharged, the threshold voltage may be relatively low (e.g., lower than 0 V), and the memory cell can be considered to be in an "unprogrammed" or "erased" state. In the example shown in FIG. 3, memory cells that are in a programmed state can be indicated by distribution 302, and memory cells that are in an unprogrammed state can be indicated by distribution 304.

A memory cell may be read by applying a sensing voltage (e.g., $V_{sense}$) to a word line of the memory cell, and then determining the corresponding state of the memory cell. As shown in FIG. 3, after a sensing voltage (e.g., $V_{sense}$ of 0 V) is applied to a memory cell in distribution 304, a control circuitry of a system (e.g., NVM interface 118 of FIG. 1, SoC control circuitry 112 of FIG. 1, and/or NVM interface 218 of FIG. 2) can read out the bit value stored in the memory cell and determine that the memory cell is in an unprogrammed state. As another example, after the same sensing voltage is applied to a memory cell in distribution 302, the control circuitry can read out the bit value stored in the memory cell and determine that the memory cell is in a programmed state.

Read operations performed on a memory cell can create read disturb issues for nearby memory cells. A "read disturb" can refer to a process where the floating gate of an unprogrammed memory cell gains charge, thereby causing the threshold voltage of the memory cell to increase. Eventually, the threshold voltage can increase to a level such that the previously unprogrammed memory cell can be considered to be in a programmed state. That is, the bit value of the memory cell can "bit flip" to a different value. For example, as a result of read disturb, a memory cell can move from distribution 304 to distribution 302, and the bit value can flip from '1' to '0'.

In some embodiments, read disturbs can occur during a read operation when a high pass voltage (e.g., $V_{pass}$) is applied to those memory cells in a block that are not being read (e.g., unselected memory cells). When unselected memory cells are held under the pass voltage, the unselected memory cells can operate as pass transistors allowing the memory cells to pass current (e.g., pass current in a NAND string) regardless of their state of programming. Generally, the pass voltage is higher than the sensing voltage applied to a memory cell that is being read (e.g., a selected memory cell).

For example, as discussed previously, memory cells in a block may be aligned in rows corresponding to word lines. Thus, when a memory cell in a particular word line is read, a pass voltage is applied to unselected memory cells in other word lines of the block. As a result of various effects caused by the application of the pass voltage, these unselected memory cells will suffer from read disturb issues over time.

In a conventional NAND system, the system may attempt to alleviate read disturbs by relocating data stored on a block after a fixed number of read operations (e.g., 10,000 read operations) have been performed on the block. A "relocation" operation can refer to a series of actions whereby control circuitry directs a bus controller (e.g., NVM bus controller 216 of FIG. 2) to copy some amount of data from one memory location of a NVM (e.g., one or more pages or blocks) to another memory location of the NVM. Unnecessary relocations can increase the number of write operations that must be performed on a NVM and correspondingly shorten the lifespan of the NVM.

Relocating after a fixed number of read operations may be suitable when reads are randomly distributed in a block. In such a case, the pages of the block have an equal probability of being read, and on average, the amount of read disturb damage caused by read operations performed on the block may be uniform.

However, read operations are frequently concentrated in particular memory locations of a block (e.g., a particular page of a block or a set of pages of a block). Because not all read operations performed on a block are equally destructive in terms of read disturb damage, the characteristics of the read operations that are performed can affect when a block needs to be relocated.

Accordingly, instead of calculating constant damage for each read operation and relocating a block after a fixed number of read operations, a system can assume that read operations may cause variable amounts of read disturb damage. A control circuitry can therefore generate a variable damage value based on an estimation of the amount of read disturb damage caused by a read operation. In addition, the control circuitry can maintain a score of the aggregated read disturb damages caused by all read operations performed on a block over a period of time.

As an example, a read operation may be performed on a particular memory location of a block (e.g., a page of the block). Upon detecting that the read operation is being performed on the memory location, the control circuitry can estimate a damage value for the read operation.

The control circuitry can estimate the damage value based on one or more characteristics of the read operation. In some embodiments, the control circuitry can determine a subset of the word lines of the block that are not associated with the memory location. That is, the control circuitry can determine which word lines of the block are being held under the pass voltage. Based on this determination, the control circuitry can estimate the damage value by calculating data associated with the bit error estimates (e.g., raw bit error rate ("RBER") estimates) for the subset of the word lines of the block. In some cases, the bit error estimates may be obtained from one or more tests performed on the block. After calculating data associated with the bit error estimates, the control circuitry can increment the score by a damage value that is based at least in part on the associated data. Persons skilled in the art will appreciate that the control circuitry can use any suitable method to calculate the data associated with the bit error estimates such as, for example, by calculating an average of the bit error estimates, a maximum of the bit error estimates, a geometric mean of the bit error estimates, any other method, and/or any combination thereof.

In other embodiments, the control circuitry can maintain a set of damage values, where each damage value of the set of damage values is associated with a corresponding word line of a block. Upon detecting that a read operation is being performed on a memory location, the control circuitry can determine which word line of the block corresponds to the memory location. Based on this determination, the control circuitry can increment the score by a damage value corresponding to the word line.

In some cases, the damage values may have different values depending on the vendor-specific architecture of a block. In some cases, word lines that are potentially more harmful in terms of read disturbs can be assigned higher damage values, and word lines that are less harmful in terms of read disturbs can be assigned lower damage values. In one implementation, for example, the last word line of the block may have the smallest damage value of the set of damage values. For instance, in some vendor-specific NVMs, the last word line of the block may have the highest RBER. Thus, when the last word line is being read and is not being held under a pass voltage, the last word line is correspondingly not accumulating as much damage and can therefore have the smallest damage value.

In further embodiments, the control circuitry can monitor the physical position of the memory location that is being read. For example, the control circuitry can determine whether the physical position of the memory location is at the beginning, middle, or end of a block. Then, based at least in part on the physical position and one or more other factors (e.g., the architecture of the block and/or one or more tests performed on the block), the control circuitry can calculate a damage value corresponding to the memory location. For example, based on one or more tests performed on the block (e.g., the tests may be run during a manufacturing process of a NVM or a host), the control circuitry may determine a susceptibility to error of the physical position of the memory location. The control circuitry can then calculate a damage value based at least in part on the susceptibility to error.

In yet further embodiments, the control circuitry can assume that longer reads may cause more read disturb damage as compared to shorter reads. Thus, for each read operation that is performed on a block, the control circuitry can calculate a damage value based at least in part on the amount of time associated with the read operation. For example, a score associated with a block may have a damage value of 80 after the control circuitry determines that a first read operation performed on the block takes 80 µs. If a second read operation then takes 120 µs, the control circuitry can add a damage value of 120 to the score for an updated score of 200. Persons skilled in the art will appreciate that this example is merely illustrative. Therefore, the control circuitry can obtain damage values using any suitable approach (e.g., by normalizing the amount of time associated with each read operation).

The score associated with the block can be a combination of the damage values associated with all read operations performed on the block over a period of time. In some embodiments, the score can be a linear combination of the damage values. In other embodiments, the score can be a weighted combination of the damage values. For example, the control circuitry can multiply a constant damage value (e.g., a damage value of 1) by a weight associated with one or more characteristics of a read operation (e.g., a physical position of the memory location) to generate a weighted damage value. The control circuitry can then update the score by adding the weighted damage value to the score. In further embodiments, the score can be a non-linear combination of the damage values.

After updating the score associated with the block, the control circuitry can determine if the score exceeds a pre-determined threshold. In some embodiments, the value of the pre-determined threshold can be adjusted based on one or more factors.

For example, the control circuitry can determine the quality or the susceptibility to error of a block based on one or more tests performed on the block. The pre-determined threshold can then be adjusted based on this determination. In particular, the control circuitry can increase the pre-determined threshold if the block has a lower susceptibility to error and decrease the pre-determined threshold if the block has a higher susceptibility to error. As another example, the control circuitry can adjust the pre-determined threshold based on one or more tolerance thresholds, where the tolerance thresholds can indicate when read operations performed on a block will likely cause read disturb damage (e.g., a tolerance threshold of the amount of time for read operations or a tolerance threshold of a number of read operations).

If the control circuitry determines that the score exceeds a pre-determined threshold, the control circuitry can direct a bus controller to relocate at least a portion of the block to a different memory location in the NVM.

In some embodiments, the control circuitry can direct the bus controller to relocate the entire block. In other embodiments, the control circuitry can direct the bus controller to relocate portions of the block over a period of time. For example, the control circuitry can determine which portion(s) to relocate based on susceptibility to error of one or more portions of the block. For instance, based on one or more tests performed on the block, the control circuitry can determine the susceptibility to error of one or more memory locations of the block (e.g., pages that fail the tests may be more susceptible to error). The control circuitry can then rank pages of the block based on decreasing susceptibility to error (e.g., from most susceptible to least susceptible), and the pages can be relocated in an order corresponding to the ranking of the pages. For instance, the control circuitry can begin by directing the bus controller to relocate pages that are more susceptible to error, and then to relocate pages that are less susceptible to error.

As another example, the control circuitry can determine which portion(s) to relocate based on a number of read operations performed on each word line of the block. For instance, the control circuitry can monitor a total number of read operations performed on each word line of the block over a period of time. The control circuitry can then rank the word lines based on decreasing total number of read operations. Consequently, pages associated with the word lines can be relocated in an order corresponding to the ranking of the word lines.

In some embodiments, a NVM (e.g., NVM 120 of FIG. 1 or NVM 220 of FIG. 2) may include a MLC block capable of storing more than one bit of data per memory cell. For example, a 2-bit MLC block may store two bits of data per memory cell (e.g., a 2-bit memory cell). That is, instead of only having two states as described above for a SLC block, each memory cell of a 2-bit MLC block can be in one of four states, where each state can correspond to a different threshold voltage range. The four states can be, for example, a fully unprogrammed state, a partially unprogrammed state, a partially programmed state, and a fully programmed state.

Figure 4:
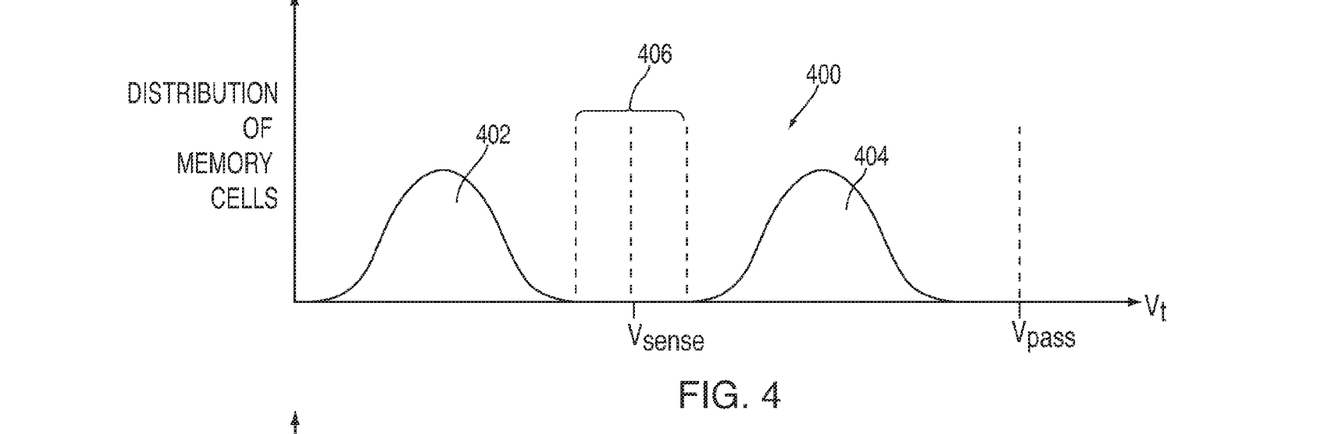
FIG. 4 is graphical view of an illustrative graph of threshold voltages for lower page programming of a multi-level cell ("MLC") block in accordance with various embodiments of the invention.

Referring now to FIG. 4, an illustrative graph 400 of threshold voltages for lower page programming of a 2-bit MLC block is shown. In order to change the state of a multi-level memory cell, the amount of charge stored in the floating gate transistor of the memory cell can be adjusted. For example, in order to program a 2-bit memory cell of a MLC block, a lower page of the block can be programmed first in order to induce charges in the memory cell. For instance, the memory cell can be charged or left uncharged to indicate a first bit value (e.g., a first bit value of '0' or '1').

Similar to SLC programming, when a transistor is charged, the threshold voltage of the memory cell may be relatively high. In contrast, when a transistor is uncharged, the threshold voltage of the memory cell may be relatively low. In the example shown in FIG. 4, memory cells that have relatively low threshold voltages can be indicated by distribution 402, and memory cells that have relatively high threshold voltages can be indicated by distribution 404.

Figure 5:
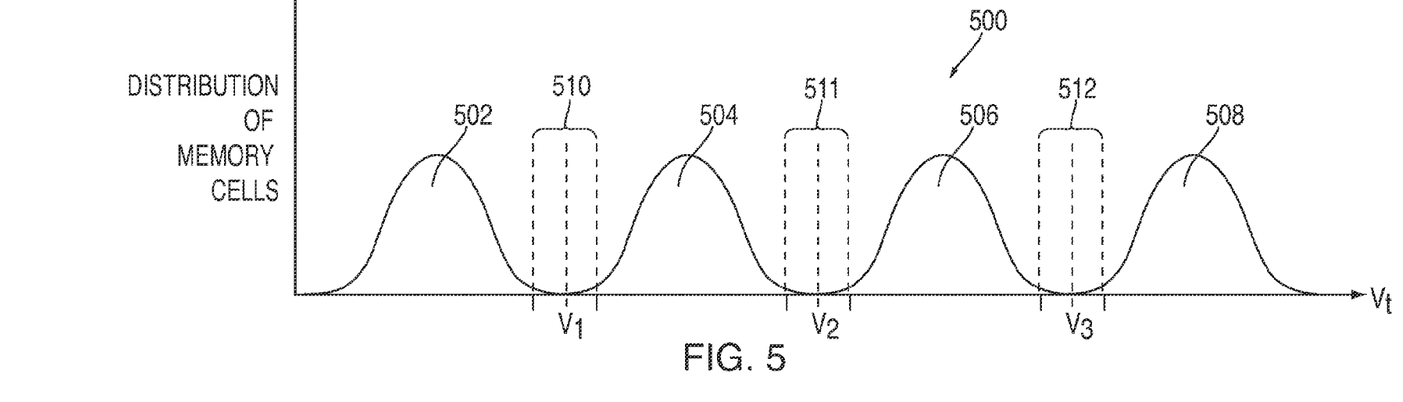
FIG. 5 is graphical view of an illustrative graph of threshold voltages for upper page programming of a MLC block in accordance with various embodiments of the invention.

After a lower page of the MLC block has been programmed, an upper page of the MLC block can be programmed in order to induce additional charges in the memory cell. For example, FIG. 5 shows an illustrative graph 500 of threshold voltages for upper page programming of a 2-bit MLC block.

During upper page programming, a memory cell can be further charged or left uncharged to indicate additional bit values. For instance, after upper page programming, a memory cell can indicate a pair of bit values (e.g., '11', '10', '01', or '00'). Each 2-bit pair can be associated with one of the four states of 2-bit memory cells. Table 1 provides the four states that can correspond to distributions 502-508 of FIG. 5.

TABLE 1

| Distribution | State |
| --- | --- |
| 502 | Fully unprogrammed |
| 504 | Partially unprogrammed |
| 506 | Partially programmed |
| 508 | Fully programmed |

As shown in FIG. 5, each state can correspond to a particular threshold voltage range. For example, the fully programmed state (e.g., distribution 508) can correspond to the highest threshold voltage range, and the fully unprogrammed state (e.g., distribution 502) can correspond to the lowest threshold voltage range.

In order to read a multi-level memory cell, each of the lower and upper pages can be read. For example, in order to read an upper page, one or more sensing voltages (e.g., $V_1$, $V_2$, and/or $V_3$) may be applied to a word line corresponding to the upper page. After a sensing voltage has been applied to the word line, data programmed in the upper page can be read out. Unfortunately, because upper page programming may produce four distributions for a particular voltage range, a higher sensitivity is required in selecting a sensing voltage for an upper page read as compared to a lower page read. For example, as shown in FIG. 5, the selected sensing voltage needs to be fairly accurate because each of the sensing margins 510-512 is relatively stringent. A slight variation in the selected sensing voltage can result in a different read out value.

As another example, in order to read a lower page, a sensing voltage can be applied to a word line corresponding to the lower page. After the sensing voltage has been applied to the word line, data programmed in the lower page can be read out. Because lower page programming may only produce two distributions for a particular voltage range, the sensing margin for a lower page read is less stringent as compared to the sensing margins for an upper page read. For instance, referring back to FIG. 4, any suitable sensing voltage (e.g., $V_{sense}$) within sensing margin 406 can be used to read a lower page.

Accordingly, the amount of read disturb damage can vary depending on whether a read operation is an upper page read or a lower page read. Because upper page reads typically take a longer period of time than lower page reads (e.g., particularly for special read algorithms), a high pass voltage needs to be applied to unselected memory cells for a longer period of time for upper page reads than for lower page reads. Consequently, the amount of pass voltage-related read disturb damage caused by an upper page read may be greater than the amount of damage caused by a lower page read.

Thus, in addition to or instead of the one or more characteristics of a read operation used to estimate read disturb damage for a SLC block, a control circuitry of a system (e.g., NVM interface 118 of FIG. 1, SoC control circuitry 112 of FIG. 1, and/or NVM interface 218 of FIG. 2) can calculate a damage value for a MLC block based at least in part on whether a read operation is a lower or upper page read. Then, as discussed previously, the control circuitry can add the damage value to a score of aggregated read disturb damages caused by all read operations performed on the MLC block over a period of time. Finally, the control circuitry can direct a bus controller (e.g., NVM bus controller 216 of FIG. 2) to relocate at least a portion of the block to a different memory location in the NVM when the score exceeds a pre-determined threshold.

For example, upon detecting that a read operation is being performed on a memory cell, the control circuitry can determine if the memory cell is an upper page or lower page of a block. If the control circuitry determines that the memory cell is an upper page of the block, the control circuitry can increment a score by a first damage value. If, however, the control circuitry determines that the memory cell is a lower page of the block, the control circuitry can increment the score by a second damage value, where the second damage value may be lower than the first damage value.

For instance, assuming that each page read has a starting damage value of one, the control circuitry can multiply the starting damage value by a weight of one for a lower page read or by a weight of two for an upper page read. The control circuitry can then update the score by adding the weighted damage value to the score. That is, a lower page read may have a weighted damage value of one, and an upper page read may have a weighted damage value of two.

As an example, if there have been 8,000 lower page reads and 1,000 upper page reads, the control circuitry can determine that the score has a value of 10,000. If the pre-determined threshold also has a value of 10,000, the control circuitry can direct the bus controller to relocate at least a portion of the block. In some embodiments, because upper page reads may be assumed to cause more read disturb damage than lower page reads, the control circuitry can direct the bus controller to relocate the upper pages of a block before relocating the lower pages of the block.

As a result of assigning different damage values for lower and upper page reads, the probability that a block will be relocated prematurely may be reduced. For example, if the system is repeatedly reading a lower page of a block (e.g., the lower page may be used to store directory information for a playlist), the control circuitry may be less active in relocating the block as compared to a situation where one or more upper pages of the block are being read repeatedly (e.g., the upper pages may be used to store media files).

Figure 6:
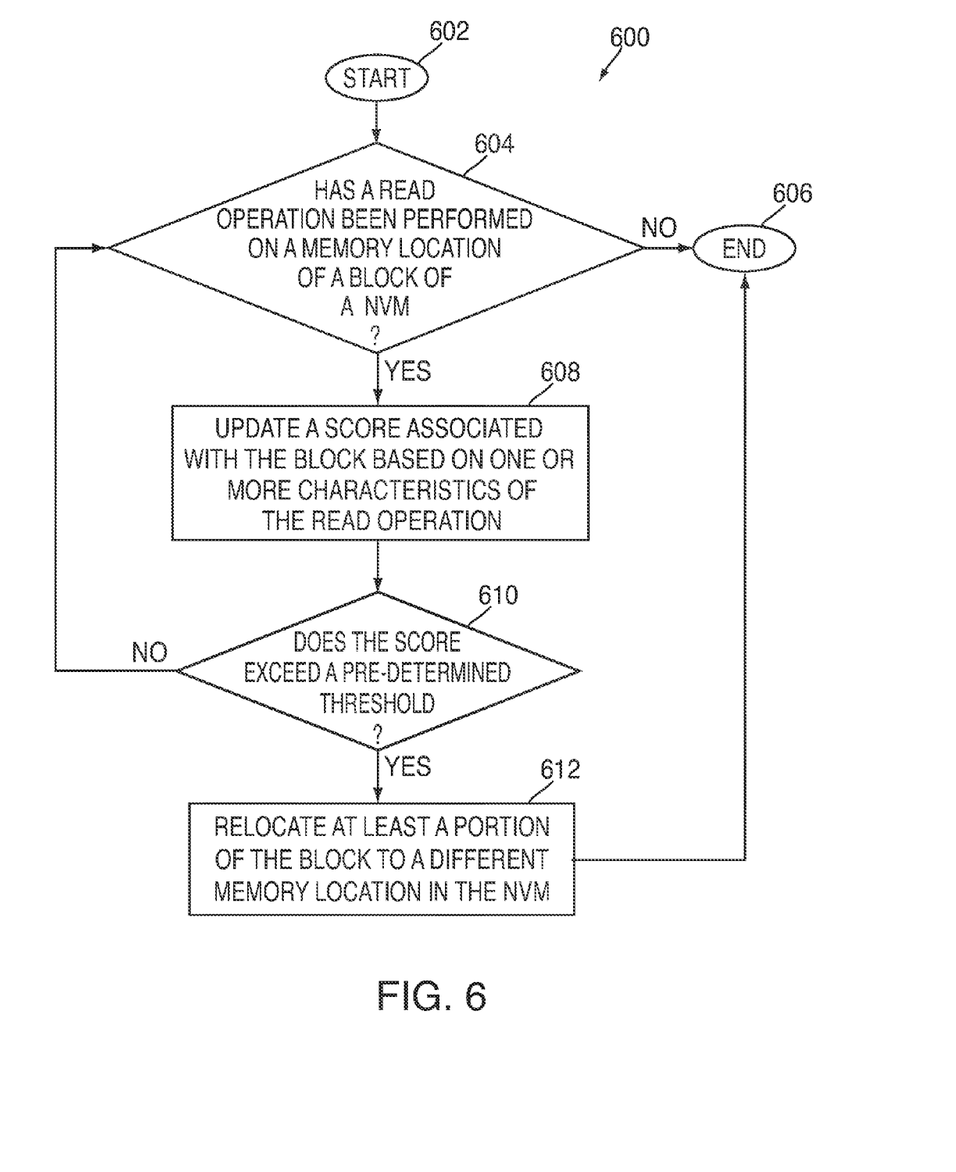
FIG. 6 is a flowchart of an illustrative process for handling read disturbs based on one or more characteristics of a read operation performed on a non-volatile memory in accordance with various embodiments of the invention.

FIG. 6 is a flowchart of an illustrative process 600 for handling read disturbs based on one or more characteristics of a read operation performed on a non-volatile memory (e.g., NVM 120 of FIG. 1 or NVM 220 of FIG. 2). Process 600 may be executed by one or more components in a system (e.g., electronic device 100 of FIG. 1 or electronic device 200 of FIG. 2). For example, at least some of the steps in process 600 of FIG. 6 may be performed by SoC control circuitry 112 (FIG. 1), NVM interface 118 (FIG. 1), or NVM interface 218 (FIG. 2).

Process 600 may begin at step 602, and at step 604, a determination is made if a read operation has been performed on a memory location of a block of a NVM. If a read operation has not been performed, process 600 may end at step 606. If a read operation has been performed, process 600 may move to step 608.

At step 608, a score associated with the block may be updated based on one or more characteristics of the read operation. The one or more characteristics may include, for example, a physical position of the memory location in the block (e.g., a beginning, middle, or end of the block and/or an upper page or lower page of the block), a word line associated with the memory location, an amount of time associated with the read operation, and/or a susceptibility to error of the memory location (e.g., obtained based on one or more tests performed on the block).

In some embodiments, a damage value can be assigned to the read operation based on the one or more characteristics. For example, for a MLC block, a read operation performed on an upper page of the block can be assigned a higher damage value than a read operation performed on a lower page of the block. The score can then be incremented by the assigned damage value.

Continuing to step 610, a determination is made if the score exceeds a pre-determined threshold. The value of the pre-determined threshold can be adjusted based on one or more factors. For example, the value of the pre-determined threshold can be adjusted based on a quality or susceptibility to error of the block (e.g., as determined based on one or more tests that have been performed on the block). As another example, the value of the pre-determined threshold can be adjusted based on one or more tolerance thresholds. For instance, the tolerance thresholds can indicate when read operations performed on a block will likely cause read disturb damage (e.g., a tolerance threshold of the amount of time for read operations or a tolerance threshold of a number of read operations).

If, at step 610, the score does not exceed the pre-determined threshold, process 600 may return to step 604, where a determination can be made if another read operation has been performed on a memory location of the block. If, at step 610, the score exceeds the pre-determined threshold, process 600 may move to step 612.

At step 612, at least a portion of the block can be relocated to a different memory location in the NVM. In some embodiments, the entire block may be relocated to another block of the NVM. In other embodiments, portions of the block may be relocated over a period of time. The order in which the portions are relocated may be determined based on the susceptibility to error of portions of the block. The susceptibility to error can be determined based on any suitable factor(s) such as, for example, one or more tests performed on the block, the total number of read operations that have been performed on each word line of the block over a period of time, and/or whether a read operation is an upper page read or lower page read.

In some embodiments, pages or word lines of the block can be ranked based on one or more of these factors (e.g., decreasing susceptibility to error, decreasing number of read operations performed on each word line, and/or whether a read operation is an upper or lower page read), and the pages or the word lines of the block can be relocated in an order corresponding to the rankings. After at least the portion of the block has been relocated, process 600 may end at step 606.

It should be understood that process 600 of FIG. 6 is merely illustrative. Any of the steps may be removed, modified, or combined, and any additional steps may be added, without departing from the scope of the invention.

The described embodiments of the invention are presented for the purpose of illustration and not of limitation.

What is claimed is:

1. A method of assigning read disturb damage to read operations of a non-volatile memory, the non-volatile memory comprising a plurality of blocks, the method comprising:
   detecting that a read operation is being performed on a memory location of a block of the plurality of blocks;
   updating a score associated with the block based on at least one characteristic of the read operation, wherein the score is updated by a value that is dependent on an estimated read disturb damage caused by the read operation;
   determining if the score exceeds a pre-determined threshold; and
   in response to determining that the score exceeds a pre-determined threshold, relocating at least a portion of the block to a different memory location in the non-volatile memory.

2. The method of claim 1, wherein the at least one characteristic of the read operation comprises the physical position of the memory location in the block.

3. The method of claim 2, wherein the physical position is one of a beginning, middle, or end of the block.

4. The method of claim 1, wherein the non-volatile memory comprises a plurality of word lines, and wherein each word line of the plurality of word lines is associated with a corresponding damage value of a set of damage values.

5. The method of claim 4, wherein a last word line of the block has the smallest damage value of the set of damage values.

6. The method of claim 1, wherein the non-volatile memory comprises a plurality of word lines, and wherein the updating further comprises:
   determining a subset of the plurality of word lines that are not associated with the memory location;
   calculating data associated with bit error estimates for the subset of the plurality of word lines; and
   incrementing the score by a damage value based at least in part on the calculated data.

7. The method of claim 6, wherein the data associated with the bit error estimates comprises at least one of an average of the bit error estimates, a maximum of the bit error estimates, or a geometric mean of the bit error estimates.

8. A method of assigning read disturb damage to read operations of a non-volatile memory, the non-volatile memory comprising a plurality of blocks, the method comprising:
   detecting that a read operation is being performed on a memory location of a block of the plurality of blocks;
   updating a score associated with the block based on at least one characteristic of the read operation, wherein the updating further comprises:
      determining that the memory location is an upper page of the block; and
      incrementing the score by a first damage value;
   determining if the score exceeds a pre-determined threshold; and
   in response to determining that the score exceeds a pre-determined threshold, relocating at least a portion of the block to a different memory location in the non-volatile memory.

9. The method of claim 8, further comprising:
   determining that the memory location is a lower page of the block; and
   incrementing the score by a second damage value, wherein the second damage value is lower than the first damage value.

10. A method of assigning read disturb damage to read operations of a non-volatile memory, the non-volatile memory comprising a plurality of blocks and a plurality of word lines, wherein each word line of the plurality of word lines is associated with a corresponding damage value of a set of damage values, the method comprising:
    detecting that a read operation is being performed on a memory location of a block of the plurality of blocks;
    updating a score associated with the block based on at least one characteristic of the read operation, wherein the updating further comprises:
       determining a word line of the plurality of word lines that corresponds to the memory location; and
       incrementing the score by a damage value of the set of damage values that corresponds to the word line;
    determining if the score exceeds a pre-determined threshold; and
    in response to determining that the score exceeds a pre-determined threshold, relocating at least a portion of the block to a different memory location in the non-volatile memory.

11. A memory interface for accessing a non-volatile memory, the non-volatile memory comprising blocks, the memory interface comprising:
    a bus controller for communicating with the non-volatile memory; and
    control circuitry operative to:
       determine that a read operation is being performed on a memory location of a block;
       update a score associated with the block by a damage value, wherein the damage value varies based on an estimation of read disturb damage caused by the read operation; and
       direct the bus controller to relocate at least a portion of the block to a different memory location in the non-volatile memory when the score exceeds a pre-determined threshold.

12. The memory interface of claim 11, wherein the control circuitry is operative to calculate the damage value based at least in part on the amount of time associated with the read operation.

13. The memory interface of claim 12, wherein the control circuitry is operative to add the damage value to the score.

14. The memory interface of claim 11, wherein the control circuitry is operative to calculate the damage value based at least in part on a physical position of the memory location in the block.

15. The memory interface of claim 14, wherein the control circuitry is operative to:
    determine a susceptibility to error of the physical position based on tests performed on the block; and
    calculate the damage value based at least in part on the susceptibility to error.

16. The memory interface of claim 14, wherein the control circuitry is operative to:

multiply the damage value by a weight associated with the physical position of the memory location to generate a weighted damage value; and add the weighted damage value to the score.

17. The memory interface of claim 11, wherein the control circuitry is operative to:
   determine a quality of the block based on tests performed on the block; and
   adjust the pre-determined threshold based on the quality of the block.

18. A memory interface for accessing a non-volatile memory, the non-volatile memory comprising blocks, the memory interface comprising:
   a bus controller for communicating with the non-volatile memory; and
   control circuitry operative to:
      determine that a read operation is being performed on a memory location of a block;
      update a score associated with the block by a damage value, wherein the damage value varies based on an estimation of read disturb damage caused by the read operation; and
      direct the bus controller to relocate at least a portion of the block to a different memory location in the non-volatile memory when the score exceeds a pre-determined threshold, wherein the control circuitry is operative to calculate the damage value based at least in part on a word line associated with the memory location.

19. A method for handling read disturbs of a non-volatile memory, the method comprising:
   maintaining a score of read disturb damage caused by read operations performed on a block of the non-volatile memory, wherein the score is a combination of damage values associated with the read operations;
   determining that the score exceeds a pre-determined threshold; and
   relocating at least one portion of the block, wherein the at least one portion of the block is determined based on a susceptibility to error of the at least one portion.

20. The method of claim 19, wherein the score is a linear combination of the damage values.

21. The method of claim 19, wherein the score is a weighted combination of the damage values.

22. The method of claim 19, wherein the score is calculated based on at least one of a physical position of a memory location that is being read, a word line associated with the memory location, an amount of time associated with a read operation, or tests performed on the block.

23. The method of claim 19, wherein the block is a multi-level cell block, and wherein the maintaining the score comprises assigning higher damage values to read operations performed on upper pages of the block than read operations performed on lower pages of the block.

24. The method of claim 19, further comprising monitoring a total number of read operations performed on word lines of the block.

25. The method of claim 24, wherein the relocating further comprises:
   ranking the word lines of the block based on a decreasing total number of read operations performed on each word line; and
   relocating pages associated with the word lines of the block in an order corresponding to the ranking of the word lines.

26. The method of claim 19, wherein the relocating further comprises relocating upper pages of the block before relocating lower pages of the block.

27. A method for handling read disturbs of a non-volatile memory, the method comprising:
   maintaining a score of read disturb damage caused by read operations performed on a block of the non-volatile memory, wherein the score is a combination of damage values associated with the read operations;
   determining that the score exceeds a pre-determined threshold; and
   relocating at least one portion of the block, wherein the at least one portion of the block is determined based on a susceptibility to error of the at least one portion, wherein the relocating comprises:
      ranking pages of the block based on decreasing susceptibility to error; and
      relocating pages of the block in an order corresponding to the ranking of the pages.

* * * * *